US010197973B2

(12) United States Patent
Gandelhman (10) Patent No.: US 10,197,973 B2
(45) Date of Patent: *Feb. 5, 2019

(54) SILICON-BASED COMPONENT WITH AT LEAST ONE CHAMFER AND ITS FABRICATION METHOD (71) Applicant: Nivarox-FAR S.A., Le Locle (CH)

(72) Inventor: Alex Gandelhman, Neuchatel (CH)

(73) Assignee: Nivarox-FAR S.A., Le Locle (CH)

( * ) Notice: Subject to any disclaimer, the term of this patent is extended or adjusted under 35 U.S.C. 154(b) by 70 days.

This patent is subject to a terminal disclaimer.

(21) Appl. No.: 15/171,012

(22) Filed: Jun. 2, 2016

(65) Prior Publication Data
US 2016/0378064 A1 Dec. 29, 2016

(30) Foreign Application Priority Data

Jun. 25, 2015 (EP) .................................... 15173823

(51) Int. Cl.
*B44C 1/22* (2006.01)
*H01L 21/3065* (2006.01)
*H01L 21/32* (2006.01)
*G04D 99/00* (2006.01)
*B81C 1/00* (2006.01)
*C23F 1/00* (2006.01)

(52) U.S. Cl.
CPC .......... *G04D 99/00* (2013.01); *B81C 1/00103* (2013.01); *C23F 1/00* (2013.01); *B81B 2201/035* (2013.01); *B81B 2203/0384* (2013.01); *B81C 2201/014* (2013.01); *B81C 2201/0132* (2013.01); *B81C 2201/0138* (2013.01)

(58) Field of Classification Search
None
See application file for complete search history.

(56) References Cited

U.S. PATENT DOCUMENTS

| 2005/0142863 A1* | 6/2005 | Spandre | H01L 21/31116 438/640 |
| 2008/0061029 A1* | 3/2008 | Lai | B81C 1/00626 216/37 |
| 2009/0014296 A1* | 1/2009 | Weber | H01H 1/0036 200/181 |
| 2010/0013060 A1* | 1/2010 | Lamy | H01L 21/76898 257/621 |

(Continued)

FOREIGN PATENT DOCUMENTS

| CH | 699 476 A2 | 3/2010 | |
| EP | 2 840 059 A * | 2/2015 | ............... B81C 1/00 |
| EP | 2 840 059 A1 | 2/2015 | |

OTHER PUBLICATIONS

European Search Report dated Nov. 30, 2015 in European Application 15 173823, filed Jun. 25, 2015 (with English Translation).

*Primary Examiner* — Shamim Ahmed
(74) *Attorney, Agent, or Firm* — Oblon, McClelland, Maier & Neustadt, L.L.P.

(57) ABSTRACT

The invention relates to a silicon-based component with at least one chamfer formed from a method combining at least one oblique side wall etching step with a "Bosch" etching of vertical side walls, thereby enabling aesthetic improvement and improvement in the mechanical strength of components formed by micromachining a silicon-based wafer.

13 Claims, 8 Drawing Sheets

(56) References Cited

U.S. PATENT DOCUMENTS

| | | | | |
|---|---|---|---|---|
| 2010/0267241 A1* | 10/2010 | Riva | ................... | B81C 1/00531 |
| | | | | 438/706 |
| 2012/0199984 A1* | 8/2012 | Fujita | ................ | H01L 21/76898 |
| | | | | 257/774 |
| 2012/0298413 A1* | 11/2012 | Mori | ...................... | H05K 3/425 |
| | | | | 174/266 |
| 2013/0115721 A1* | 5/2013 | Clark | ................ | H01L 21/02532 |
| | | | | 438/12 |
| 2013/0154051 A1* | 6/2013 | Tournier | ........... | H01L 21/30655 |
| | | | | 257/510 |
| 2014/0030868 A1* | 1/2014 | Parthasarathy | ....... | H01L 29/407 |
| | | | | 438/430 |
| 2015/0179737 A1* | 6/2015 | Schulze | .............. | H01L 21/3065 |
| | | | | 257/496 |

* cited by examiner

SILICON-BASED COMPONENT WITH AT LEAST ONE CHAMFER AND ITS FABRICATION METHOD

This application claims priority from European Patent Application No. 15173823.4 filed on Jun. 25, 2015, the entire disclosure of which is hereby incorporated by reference.

FIELD OF THE INVENTION

The invention relates to silicon-based micromechanical component with at least one chamfer and a method for fabrication of the same. More specifically, the invention relates to such a component formed by micromachining a silicon-based wafer.

BACKGROUND OF THE INVENTION

CH Patent 698837 discloses the fabrication of a timepiece component by micromachining a wafer of amorphous or crystalline material, such as crystalline or polycrystalline silicon.

Such micromachining is generally obtained by deep reactive ion etching (also known by the abbreviation "DRIE"). As illustrated in FIGS. 1 to 4, a known micromachining method consists in structuring a mask 1 on a substrate 3 (cf. FIG. 1, step A) followed by a "Bosch" deep reactive ion etching combining in succession an etching phase (cf. FIG. 1, steps B, D, E) followed by a passivation phase (cf. FIG. 1, step C, layer 4) in order to obtain from the pattern of mask 1, an anisotropic, i.e. substantially vertical, etch 5, in the wafer (cf. FIGS. 2 and 4).

Figure 1:
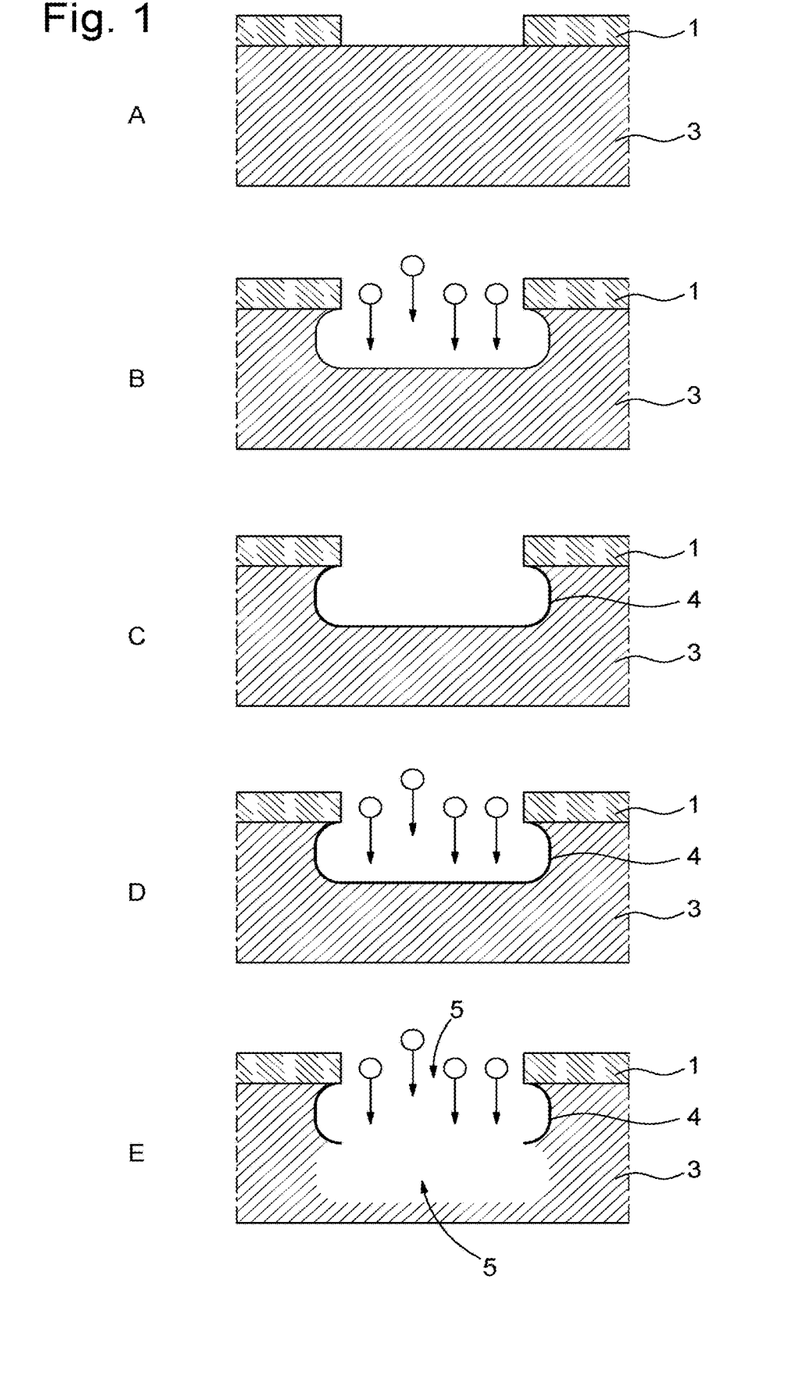
FIGS. 1 to 4 are diagrams intended to explain the "Bosch" deep reactive ion etching process used within the scope of the invention.
Figure 2:
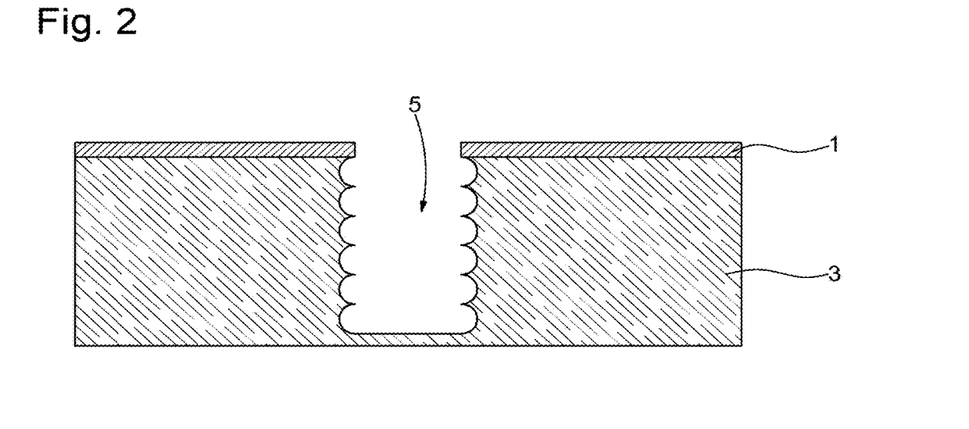
Figure 3:
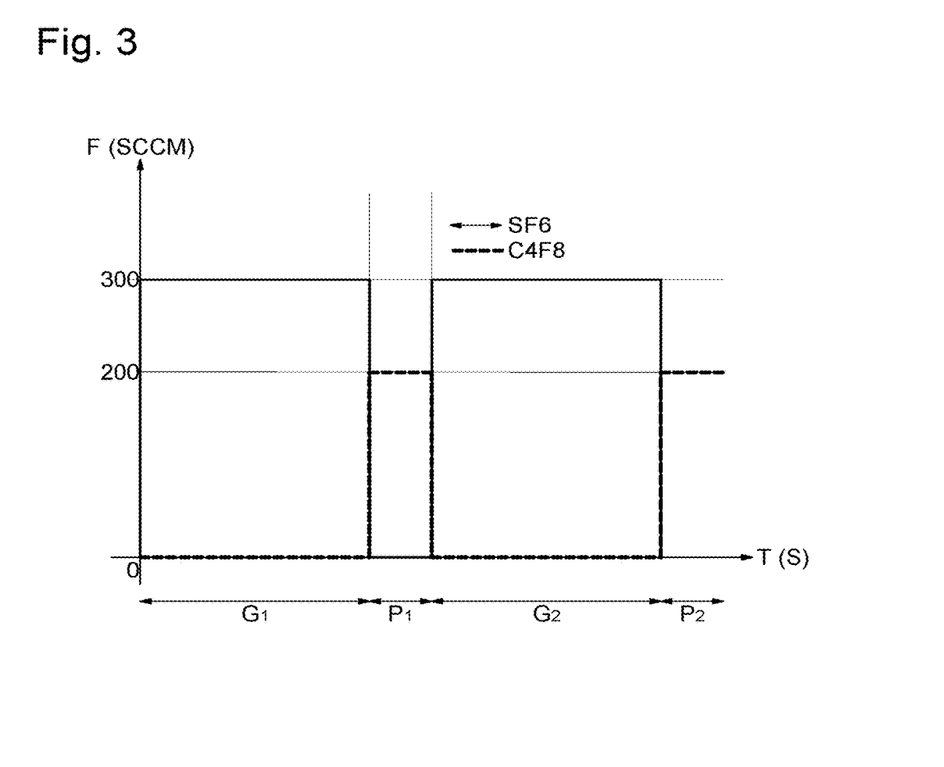
Figure 4:
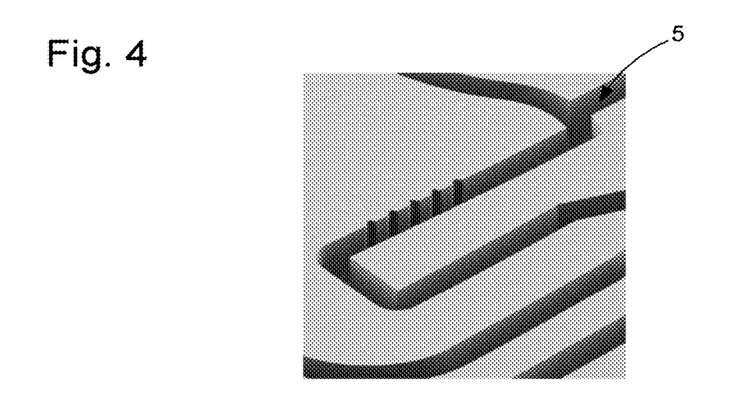

As illustrated in FIG. 3, an example of a "Bosch" deep reactive ion etching is shown with, in solid lines, the flow of $SF_6$ in sccm as a function of time in seconds, for etching a silicon wafer and, in dotted lines, the flow of $C_4F_8$ in sccm as a function of time in seconds, for the passivation, i.e. the protection, of the silicon wafer. It is thus clearly seen that the phases are strictly consecutive and each have a specific flow and time.

In the example of FIG. 3, there is shown a first etching phase $G_1$, with a flow of $SF_6$ at 300 sccm for 7 seconds, followed by a first passivation phase $P_1$ with a flow of $C_4F_8$ at 200 sccm for 2 seconds, followed by a second etching phase $G_2$ with a flow of $SF_6$ at 300 sccm for 7 seconds again, and finally, followed by a second passivation phase $P_2$ with a flow of $C_4F_8$ at 200 sccm for 2 seconds again, and so on. It is thus noted that a certain number of parameters enable the "Bosch" deep reactive ion etch process to be varied to obtain more or less marked scalloping in the wall of vertical etch 5.

After several years of fabrication, it was found that these vertical etches 5 were not entirely satisfactory, particularly due to the right-angled edges which are prone to chipping and to the "crude" nature of the components obtained.

SUMMARY OF THE INVENTION

It is an object of the present invention to overcome all or part of the aforecited drawbacks by proposing a new type of silicon-based micromechanical component and a new type of fabrication method, in particular, to improve the aesthetics and to improve the mechanical strength of components formed by micromachining a silicon-based wafer.

The invention therefore relates to a method for fabricating a micromechanical component made of a silicon-based material including the following steps:
a) taking a silicon-based substrate;
b) forming a mask pierced with holes on a horizontal portion of the substrate;
c) etching, in an etching chamber, predetermined oblique walls, in part of the thickness of the substrate from holes in the mask, in order to form upper chamfered surfaces of the micromechanical component;
d) etching, in the etching chamber, substantially vertical walls, in at least part of the thickness of the substrate from the bottom of the first etch made in step c), in order to form peripheral walls of the micromechanical component beneath the upper chamfered surfaces;
e) releasing the micromechanical component from the substrate and the mask.

It is understood that two distinct types of etch are obtained in the same etching chamber without removing the substrate from the chamber. It is immediately clear that the oblique etching in step c) removes the substantially right-angled edges respectively between the vertical peripheral or inner walls etched to form several micromechanical components in the same substrate and the upper and lower surfaces of the substrate. It can also be observed that the oblique etching in step c) allows for a considerably more open angle and a substantially rectilinear direction of etching, which avoids being limited by the parameters of a "Bosch" deep reactive ion etching, which is, conversely used in step d) with optimised vertical etching parameters.

In accordance with other advantageous variants of the invention:
step c) is achieved by mixing the etching gas and the passivation gas in the etching chamber in order to form the predetermined oblique walls;
in step c), the continuous etching and passivation gas flows are pulsed to enhance the passivation at the bottom level;
step d) is achieved by alternating an etching gas flow and a passivation gas flow in the etching chamber in order to form the substantially vertical walls;
between step d) and step e), the method further includes the following steps: f): forming a protective layer on the predetermined oblique walls and the substantially vertical walls leaving the bottom of the etch of step d) without any protective layer and g): etching, in the etching chamber, second predetermined oblique walls, in the remaining thickness of the substrate from the bottom of the etch made in step d) without any protective layer, in order to form lower chamfered surfaces of the micromechanical component;
step g) is achieved by mixing the etching gas and the passivation gas in the etching chamber in order to form second predetermined oblique walls;
in step g), the continuous etching and passivation gas flows are pulsed to enhance the etching at the bottom level;
step f) includes the following phases: f1): oxidising the predetermined oblique walls and substantially vertical walls to form the protective silicon oxide layer; and f2): directionally etching the silicon oxide protective layer in order to selectively remove only the part of the protective layer from the bottom of the etch made in step d);
before step e), the method further includes step h): filling a cavity created during the etchings of the micromechanical component, formed by an upper chamfered surface, a peripheral wall and a lower chamfered surface, with a metal or metal alloy in order to provide an attachment to the micromechanical component.

Moreover, the invention relates to a micromechanical component obtained from the method according to any of the preceding variants, wherein the component includes a silicon-based body whose substantially vertical peripheral wall borders a horizontal upper surface via an upper chamfered surface.

Advantageously according to the invention, the micromechanical component enjoys a considerable aesthetic improvement by forming components which have a much more elaborate aesthetic finish. Further, the substantially rectilinear chamfered surface provides improved mechanical strength, particularly by reducing the possibility of chips to the substantially right-angled edges respectively between the vertical peripheral and/or inner walls and the upper and/or lower surfaces of the micromechanical component.

It is also clear that the vertical peripheral and/or inner walls provide a reduced contact surface offering an improvement as regards tribological contact with other components or as regards the insertion of a member along an inner wall of the micromechanical component. Finally, the recessed areas of the vertical peripheral and/or inner walls are more open as a result of the chamfered surface which may enable an increase in volume capacity for receiving adhesive or lubricant.

In accordance with other advantageous variants of the invention:
the substantially vertical peripheral wall of the body also borders a horizontal lower surface via a lower chamfered surface;
the micromechanical component also includes at least one cavity including a substantially vertical inner wall also including intermediate upper and lower chamfered surfaces between said upper and lower horizontal surfaces;
said at least one cavity is at least partially filled with a metal or a metal alloy to provide an attachment to the micromechanical component;
the micromechanical component forms all or part of an element in the movement or external parts of a timepiece.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

Figure 18:
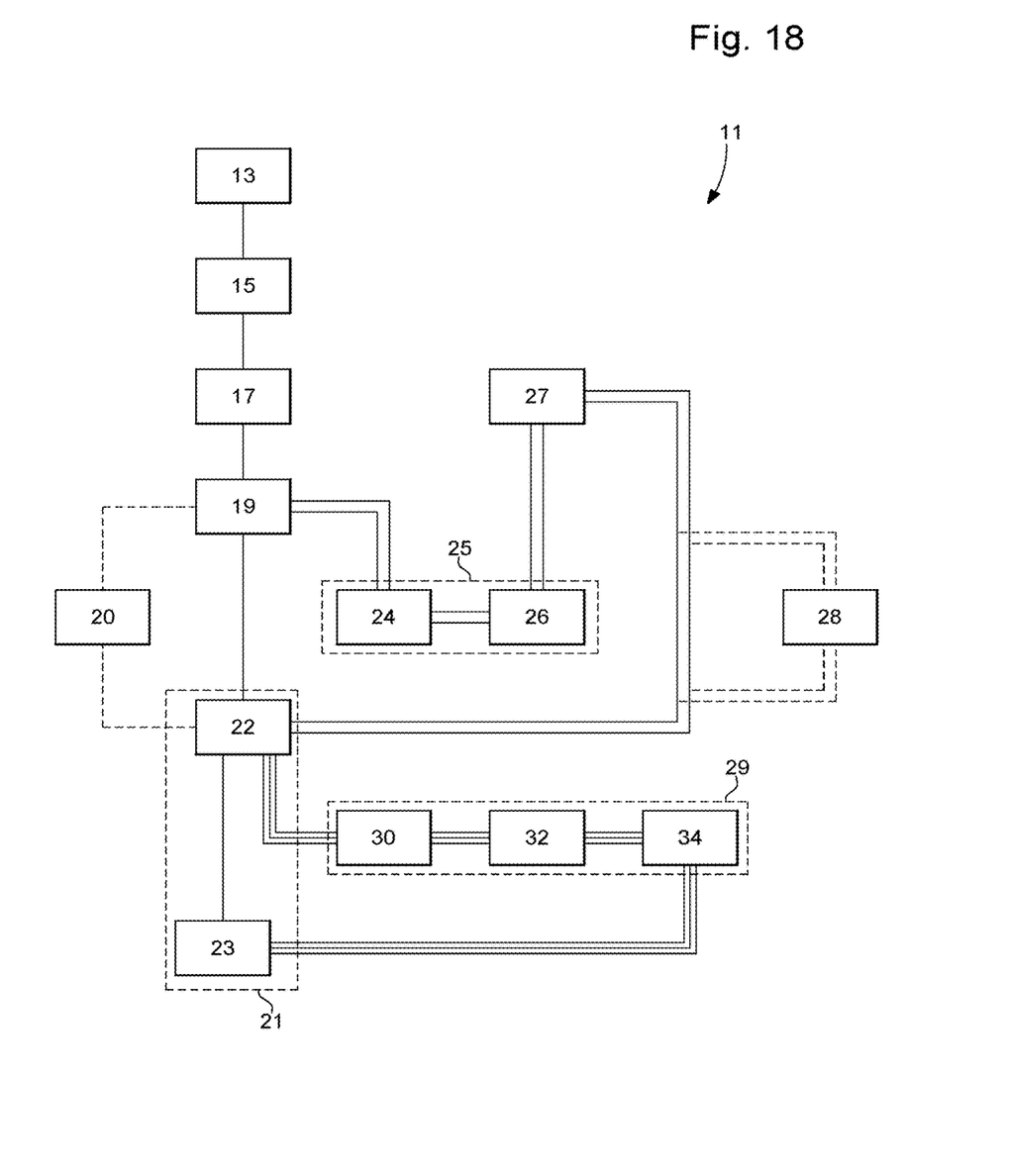
FIG. 18 is a flow diagram of the fabrication methods according to the invention.

The invention relates to a method 11 for fabricating a silicon-based micromechanical part. As illustrated in FIG. 18, method 11 according to a first embodiment illustrated in a single line, includes a first step 13 consisting of taking a silicon-based substrate.

The term "silicon-based" means a material including single crystal silicon, doped single crystal silicon, polycrystalline silicon, doped polycrystalline silicon, porous silicon, silicon oxide, quartz, silica, silicon nitride or silicon carbide. Of course, when the silicon-based material is in crystalline phase, any crystalline orientation may be used.

Figure 9:
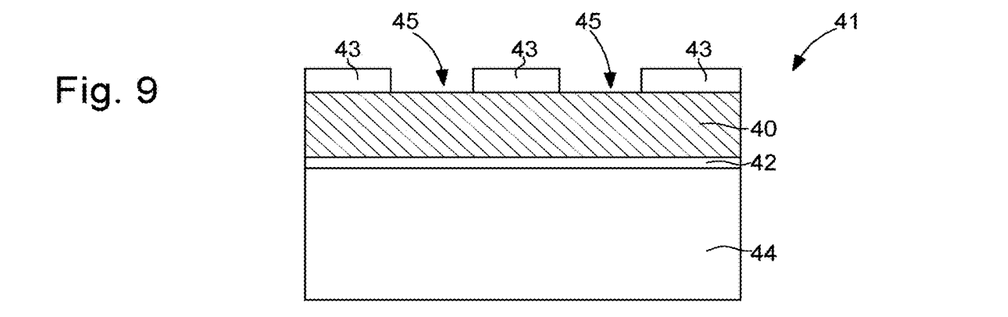
Figure 10:
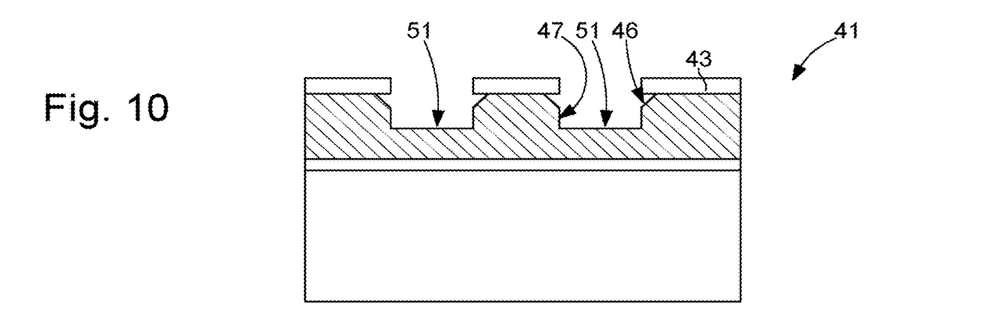

Typically, as illustrated in FIG. 9, the silicon-based substrate 41 may be a silicon-on-insulator substrate (also known by the abbreviation "SOI") comprising an upper silicon layer 40 and a lower silicon layer 44 joined by an intermediate silicon oxide layer 42. However, alternatively, the substrate could comprise a silicon layer added to another type of base such as, for example, a metal base.

The method according to the first embodiment continues with step 15 of forming a mask 43 pierced with holes 45 on a horizontal portion of substrate 41. In the example of FIG. 9, mask 43 is formed on the upper portion of upper silicon layer 40. Mask 43 is formed from a material capable of withstanding the future etching steps of method 11. Thus, mask 43 may be formed from silicon nitride or from silicon oxide. In the example of FIG. 9, mask 43 is formed from silicon oxide.

Advantageously according to the invention, method 11 according to the first embodiment continues with a step 17 of etching, from holes 45 in mask 43, predetermined oblique walls 46, in a part of the thickness of substrate 41, in an etching chamber, in order to form upper chamfered surfaces of the micromechanical component.

Oblique etching step 17 is not a "Bosch" deep reactive ion etching described above. Indeed, step 17 allows for a much more open angle and a substantially rectilinear etching direction, which avoids being limited by the parameters of a "Bosch" deep reactive ion etching. Indeed, it is generally considered that, even by modifying the parameters of a "Bosch" deep reactive ion etch, the opening angle cannot exceed 10 degrees with a curved etching direction.

Figure 5:
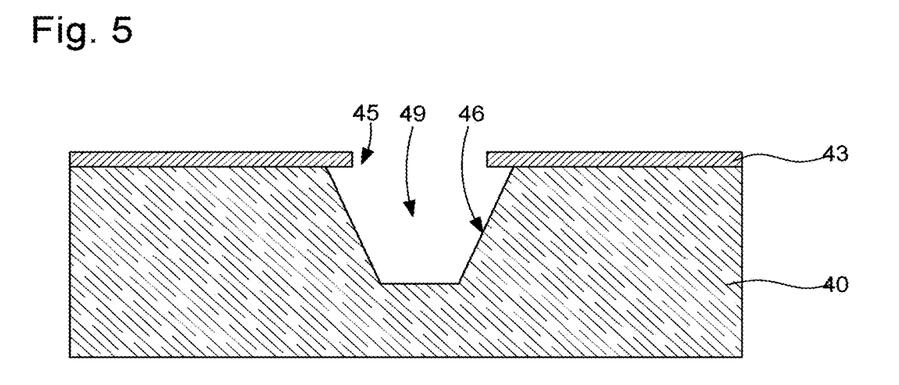
FIGS. 5 to 10 are diagrams of the fabrication steps of a micromechanical component according to a first embodiment of the invention.
Figure 6:
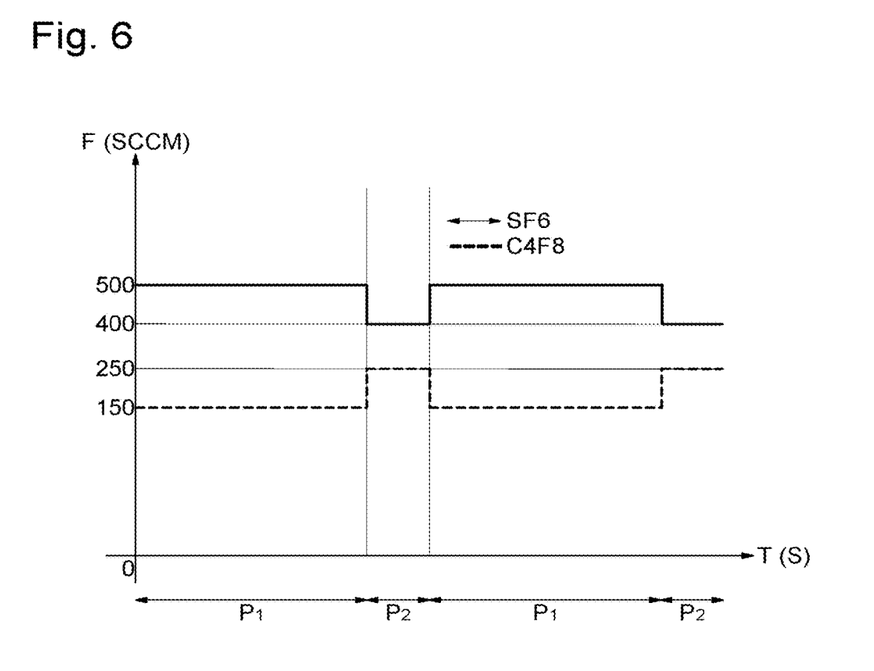

Indeed, as seen in FIGS. 5 and 6, advantageously according to the invention, step 17 is achieved by mixing the $SF_6$ etching gas and the $C_4F_8$ passivation gas in the etching chamber in order to form oblique walls 46. More specifically, the continuous $SF_6$ etching and $C_4F_8$ passivation gas flows are pulsed to enhance the passivation at the bottom level of the progressively formed cavity.

It is thus understood that step 17 allows for a much more open angle, typically around 45 degrees in the FIG. 5 example, instead of the maximum of 10 degrees obtained using a "Bosch" deep reactive ion etching with most optimised parameter modification. Advantageously according to the invention, step 17 can thus give a precise opening angle. The angle between the future vertical walls 47 and oblique walls 46 is highly reproducible and can advantageously be comprised between substantially 0° and substantially 45°. As explained above, it is particularly the possibility of etching at an angle of more than 10° which is remarkable compared to a "Bosch" deep reactive ion etch. Preferably, the angle according to the invention between the future vertical walls 47 and oblique walls 46 is greater than 10° and less than 45°, and even more preferably, greater than 20° and less than 40°.

Further, the continuous flow pulsation allows for improved etching directivity, and can even provide substantially truncated cone-shaped walls and not spherical walls (sometimes called isotropic etches) as with a wet etch or a dry etch, for example, using only $SF_6$ gas.

To obtain the shape of walls 46 in FIG. 5, the sequence of FIG. 6 may, for example, be applied. This sequence includes a first phase $P_1$ with a flow of $SF_6$ at 500 sccm mixed with a flow of $C_4F_8$ at 150 sccm for 1.2 seconds, followed by a second phase $P_2$ shown with a flow of $SF_6$ at 400 sccm mixed with a flow of $C_4F_8$ at 250 sccm for 0.8 seconds, followed by a third phase $P_1$ again with a flow of $SF_6$ at 500 sccm mixed with a flow of $C_4F_8$ at 150 sccm for 1.2 seconds and followed by a fourth phase $P_2$ with a flow of SF6 at 400 sccm mixed with a flow of $C_4F_8$ at 250 sccm for 0.8 seconds and so on.

It is thus noted that the continuous flow pulsation enhances the passivation at the bottom level of the progressively formed cavity which will gradually restrict, in step 17, the possible opening of etch 49 as a function of its depth and, incidentally, a wider etch opening 49 in the upper portion of upper layer 40 until there is obtained an etch opening 49 wider than hole 45 in the upper portion of upper layer 40, as seen in FIG. 5.

Method 11 according to the first embodiment continues with step 19 of etching, in the same etching chamber and with the same mask 43, substantially vertical walls 47, in at least part of the thickness of layer 40 of substrate 41 from the bottom of the first etch 49, in order to form the substantially vertical peripheral walls of the micromechanical component beneath the upper chamfered surfaces.

The substantially vertical etching step 19 is typically a "Bosch" deep reactive ion etching described above, i.e. alternating an etching gas flow and a passivation gas flow in the etching chamber so as to form substantially vertical walls.

Figure 7:
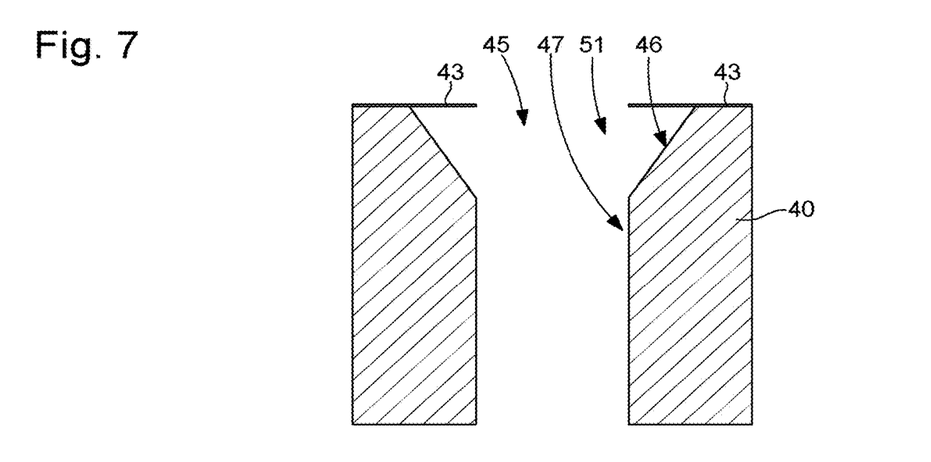

Thus, step 19 allows for a substantially vertical etching direction relative to mask 43, as seen in FIG. 7, which is a section obtained after step 19. There is thus obtained an etching section 51 whose base substantially forms a right-angled quadrilateral followed by substantially conical tapering.

The first embodiment ends with step 21 of releasing the micromechanical component from substrate 41 and from mask 43. More specifically, in the example shown in FIG. 7, step 21 may include a deoxidation phase 22 to remove the silicon oxide mask 43 and, possibly, part of the intermediate silicon oxide layer 42, and then a release phase 23 from substrate 41 with the aid, for example, of a selective chemical etch.

The first embodiment of method 11 illustrated in single lines in FIG. 18 allows for two different types of etching in the same etching chamber without removing the substrate from the chamber. It is immediately clear that the oblique etching of step 17 removes the substantially right-angled edges between the etched vertical peripheral and/or internal walls and the upper and lower surfaces of layer 40 of substrate 41 to form one or more micromechanical components on the same substrate 41.

It can also be observed that the oblique etching of step 17 allows for a much more open angle and a substantially rectilinear direction of etching, which avoids being limited by the parameters of a "Bosch" deep reactive ion etching and using the latter in step 19 with optimised vertical etching parameters.

Figure 16:
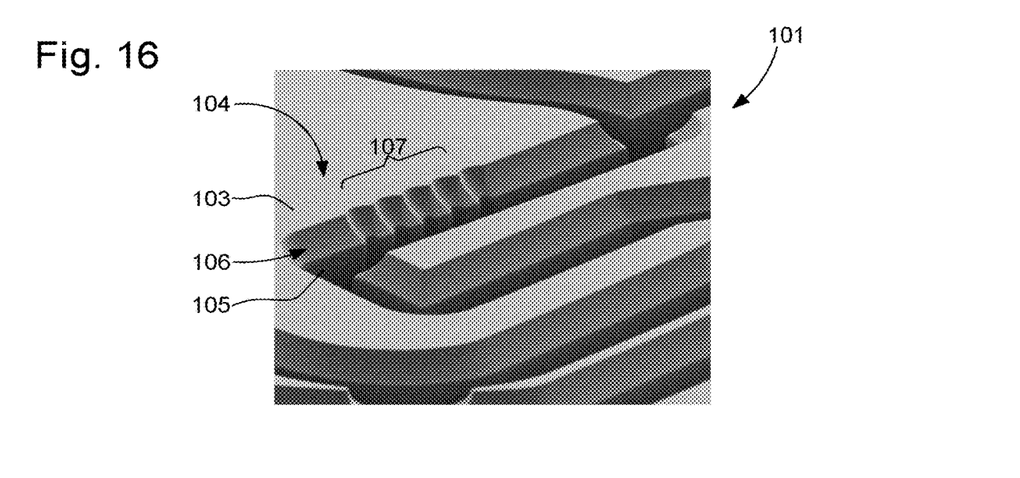

Advantageously according to the invention, the micromechanical component 101 that forms a pallets in the example of FIG. 16 enjoys a considerable aesthetic improvement by offering a much more elaborate finish. Indeed, in comparison to FIG. 4, the elaborate nature of micromechanical component 101 is immediately apparent.

Figure 8:
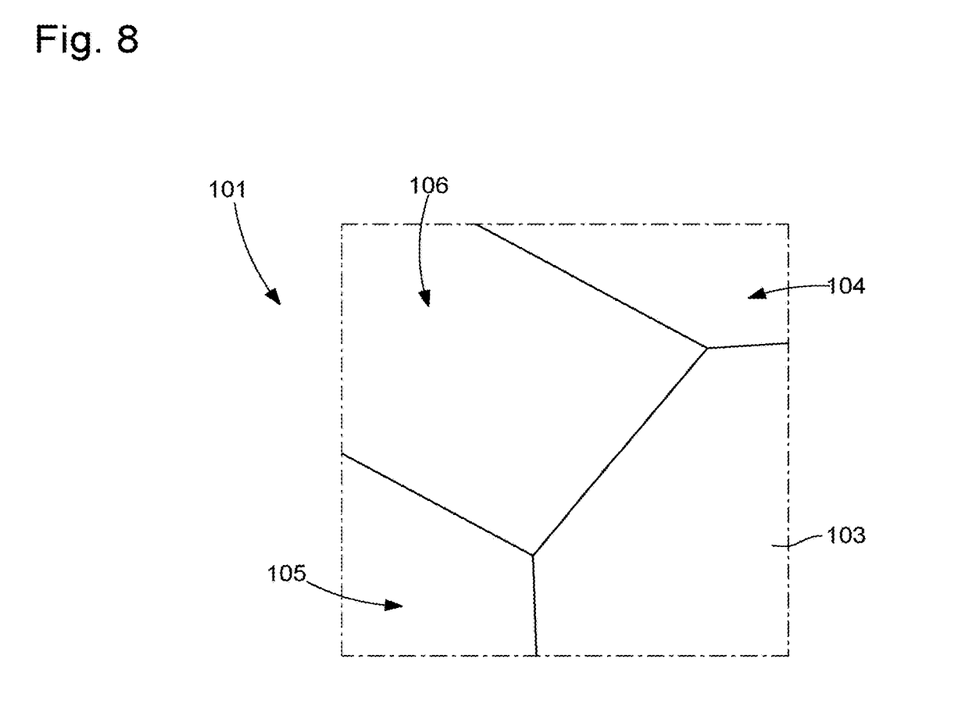

As seen more clearly in FIG. 8, which is an enlarged view of a portion of component 101, micromechanical component 101 thus includes a silicon-based body 103 whose vertical peripheral wall 105 borders a horizontal upper surface 104 via an upper chamfered surface 106.

It is thus clear that the substantially rectilinear upper chamfered surface 106 provides improved mechanical strength, particularly by reducing the possibility of chips to the substantially right-angled edges respectively between the vertical peripheral and/or inner walls 105 and the upper or lower surfaces 104 of micromechanical component 101.

It is also clear that substantially vertical peripheral wall 105 provides a reduced contact surface offering an improvement as regards tribological contact with other components or as regards the insertion of a pallet-stone between two substantially vertical walls 105 of micromechanical component 101. Finally, the recessed portions of the substantially vertical peripheral and/or inner walls 105 are more open as a result of upper chamfered surface 106, which may enable an increase in volume capacity for receiving adhesive or lubricant, as in the case of recessed portions 107 seen in FIG. 16, which are used to receive a material capable of attaching a pallet-stone to the pallets.

According to a second embodiment of the invention, method 11 comprises the same steps 13 to 19 as the first embodiment with the same features and technical effects. The second embodiment of method 11 further includes the steps shown in double lines in FIG. 18.

Figure 12:
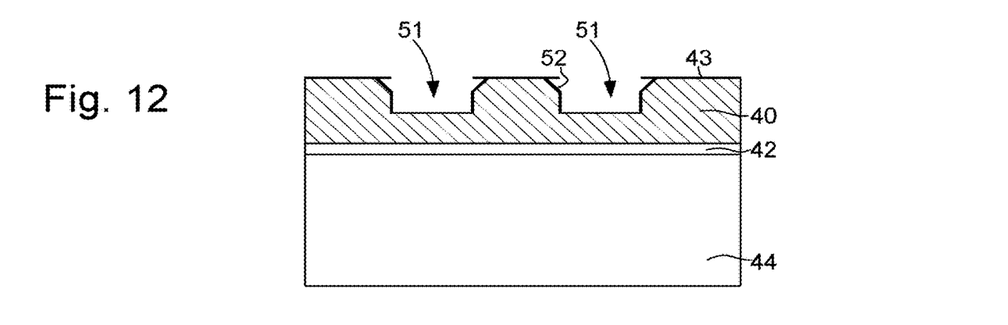

Thus, after step 19 of forming etch 51, method 11 of the second embodiment continues with step 25 of forming a protective layer 52 on oblique walls 46 and substantially vertical walls 47, leaving the bottom of etch 51 without any protective layer, as seen in FIG. 12.

Figure 11:
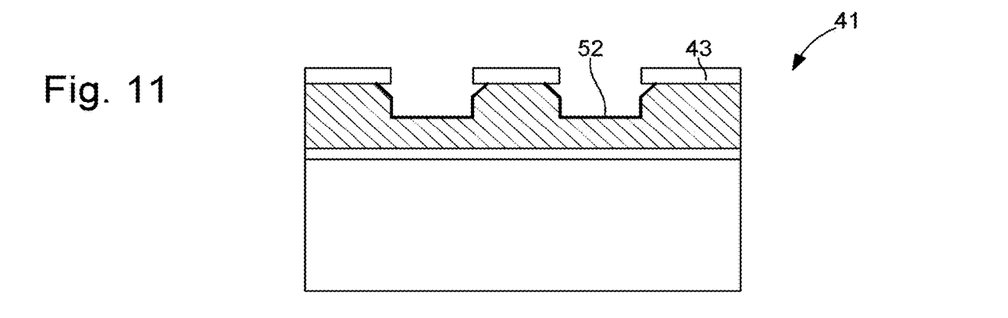
FIGS. 11 to 16 are diagrams of the fabrication steps of a micromechanical component according to a second embodiment of the invention.

Preferably, protective layer 52 is formed of silicon oxide. Indeed, as seen in FIGS. 11 and 12, step 25 may then comprise a first phase 24 intended to oxidise the entire top of substrate 41, i.e. mask 43 (when made of silicon oxide), and the walls of etch 51, to form an added thickness on mask 43 and a thickness on oblique walls 46, vertical walls 47 and the bottom of etch 51, to form the protective silicon oxide layer 52, as seen in FIG. 11.

The second phase 26 could then consist in directionally etching protective layer 52 in order to selectively remove the horizontal silicon oxide surfaces from a part of mask 43 and from the entire part of protective layer 52 only on the bottom of etch 51 as seen in FIG. 12.

Method 11 according to the second embodiment may then continue with step 27 of etching, in the same etching chamber, second predetermined oblique walls 48, in the remaining thickness of substrate 41 from the bottom of the etch 51 made in step 19 without any protective layer 52, in order to form lower chamfered surfaces of the micromechanical component.

Oblique etching step 27, like step 17, is not a "Bosch" deep reactive ion etching like step 19 described above. Thus, in combination with protective layer 52, step 27 allows for a much more open angle and a substantially rectilinear etching direction, which avoids being limited by the parameters of a "Bosch" deep reactive ion etching. Indeed, it is generally considered that, even by modifying the parameters of a "Bosch" deep reactive ion etch, the opening angle cannot exceed 10 degrees with a curved etching direction.

Figure 13:
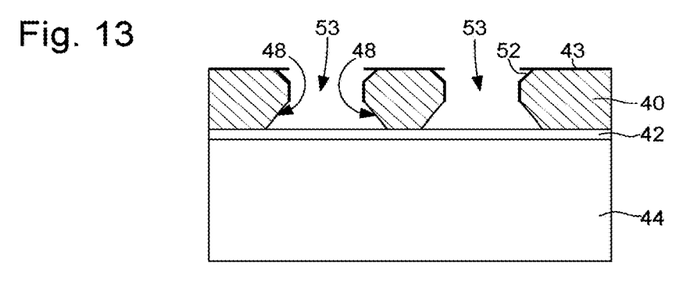
Figure 15:
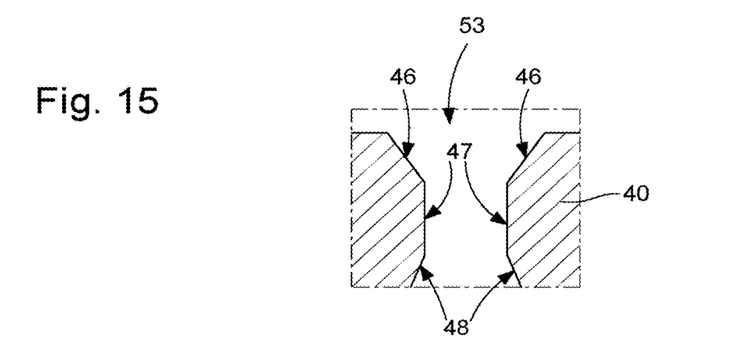

Consequently, as seen in FIGS. 13 and 15, advantageously according to the invention, step 27 is achieved by mixing the $SF_6$ etching gas and the $C_4F_8$ passivation gas in the etching chamber in order to form second oblique walls 48. More specifically, the continuous $SF_6$ etching and $C_4F_8$ passivation gas flows are preferably pulsed to enhance the etching at the bottom level of the progressively formed cavity.

It is thus understood that step 27 allows for a much more open angle, typically around 45 degrees in the FIG. 13 example, instead of the maximum of 10 degrees obtained using a "Bosch" deep reactive ion etching with most optimised parameter modification. Advantageously according to the invention, step 27 can thus give a precise opening angle without modifying the surfaces of oblique walls 46 and vertical walls 47. The angle between vertical walls 47 and oblique walls 48 is highly reproducible and can advantageously be comprised between substantially 0° and substantially 45°. As explained above, it is particularly the possibility of etching at an angle of more than 10° which is remarkable compared to a "Bosch" deep reactive ion etching. Preferably, the angle according to the invention between vertical walls 47 and oblique walls 48 is greater than 10° and less than 45°, and even more preferably, greater than 20° and less than 40°.

Further, the continuous flow pulsation allows for improved etching directivity, and can even provide substantially truncated cone-shaped walls and not spherical walls (sometimes called isotropic etches) as with a wet etch or a dry etch, for example, using only $SF_6$ gas.

To obtain the shape of walls 48 in FIG. 13, a reverse sequence to FIG. 6 may, for example, be applied. This sequence could thus include a first phase with a flow of $SF_6$ mixed with a flow of $C_4F_8$ for a first duration, followed by a second phase with an increased flow of $SF_6$ mixed with a reduced flow of $C_4F_8$ for a second duration, and then the first and second phases again and so on.

It is thus noted that the continuous flow pulsation enhances the etching at the bottom level of the progressively formed cavity which will gradually widen, in step 27, the possible opening of etch 53 as a function of its depth and, incidentally, a wider etch opening 53 in the lower portion of upper layer 40 until there is obtained an etch opening 53 wider than hole 45 in the mask 43 and than the section of the bottom of etch 51 at the start of step 27, as seen in FIG. 13, without modifying the previously performed etch 51.

Figure 14:
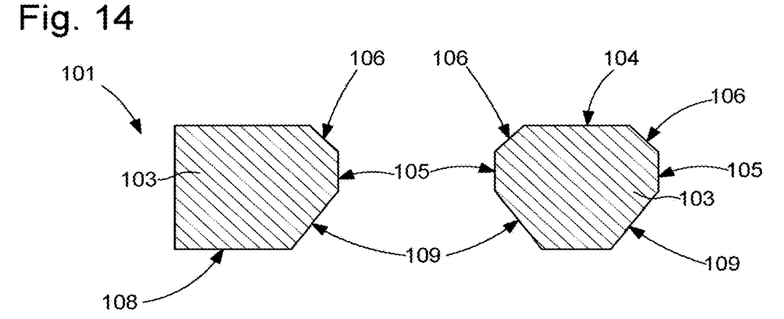

The second embodiment ends, like the first embodiment, with step 21 of releasing the micromechanical component from layer 40 of substrate 41 and from mask 43. More specifically, in the example shown in FIGS. 14 and 15, step 21 may include a deoxidation phase 21 to remove the silicon oxide mask 43, protective layer 52 and, possibly, all or part of the intermediate silicon oxide layer 42 as illustrated in FIG. 13, and then a release phase 23 from substrate 41 with the aid, for example, of a selective chemical etch as illustrated in FIG. 14.

The second embodiment of method 11 illustrated in single and double lines in FIG. 18 removes the substantially right-angled edges between the etched vertical peripheral and/or internal walls and the upper and lower horizontal surfaces of layer 40 of substrate 41 to form one or more micromechanical components on the same substrate 41.

It can also be observed that the oblique etching of steps 17 and 27 allows for a considerably more open angle and a substantially rectilinear direction of etching, which avoids being limited by the parameters of a "Bosch" deep reactive ion etching and using the latter in step 19 with optimised vertical etching parameters.

Advantageously according to the invention, the micromechanical component 101 that forms a pallets in the example of FIG. 16 enjoys a considerably aesthetic improvement by offering a much more elaborate aesthetic finish. Indeed, in comparison to FIG. 4, the elaborate nature of micromechanical component 101 is immediately apparent, both on upper face 104 and on lower face 108.

As seen more clearly in FIGS. 8 & 14, micromechanical component 101 thus includes a silicon-based body 103 whose vertical peripheral wall 105 borders a horizontal upper surface 104 via an upper chamfered surface 106 and a horizontal lower surface 108 via a lower chamfered surface 109.

It is thus understood that the substantially rectilinear upper and lower chamfered surfaces 106, 109 provide improved mechanical strength, particularly by reducing the possibility of chips to the substantially right-angled edges respectively between the vertical peripheral and/or inner walls 105 and the upper and/or lower horizontal surfaces 104, 108 of micromechanical component 101.

It is also clear that vertical peripheral wall 105 provides a reduced contact surface offering an improvement as regards tribological contact with other components or as regards the insertion of a member along an inner wall of the micromechanical component.

Finally, the recessed portions of the vertical peripheral and/or inner walls 105 are more open as a result of upper and lower chamfered surfaces 106, 109, which can enable an increase in volume capacity for receiving adhesive or lubricant, as in the case of recessed portions 107 seen in FIG. 16, which are used to receive a material capable of attaching a pallet-stone to the pallets.

According to a third embodiment of the invention, method 11 comprises the same steps 13 to 27 and phase 22 as the second embodiment, with the same features and technical effects. The third embodiment of method 11 further includes the steps seen in triple lines in FIG. 18.

Thus, after phase 22 of deoxidizing substrate 41, method 11 according to the third embodiment continues with step 29 of filling a cavity created during etchings 17, 19 and 27 of the micromechanical component, formed by an upper chamfered surface, a peripheral wall and a lower chamfered surface, with a metal or metal alloy in order to provide an attachment to the micromechanical component.

In a preferred example, lower layer 44 of substrate 41 is highly doped and used as the direct or indirect base for filling by electroplating. Thus, step 29 could include a first phase 30 of forming a mould, for example made of photosensitive resin, on top of mask 43 and in a part of etch 53. A second phase 32 could consist in electroplating a metal part 112, from lower layer 44, at least between the micromechanical silicon-based component and a part of the mould formed in etch 53. Finally, a third phase 34 could consist in removing the mould formed in the phase 30.

The third embodiment ends with phase 23 of releasing the composite micromechanical component from substrate 41 by a selective chemical etch.

The third embodiment of method 11, illustrated in single, double and triple lines in FIG. 18, removes the substantially right-angled edges respectively between the vertical peripheral and/or internal walls and the upper and lower horizontal surfaces of substrate 41 to form one or more composite silicon-based and metal micromechanical components 111 formed on the same substrate 41.

It can also be observed that the oblique etching of steps 17 and 27 allows for a considerably more open angle and a substantially rectilinear direction of etching, which avoids being limited by the parameters of a "Bosch" deep reactive ion etch and using the latter in step 19 with optimised vertical etching parameters.

Advantageously according to the invention, the composite micromechanical component, able to form a pallets as in the FIG. 16 example, enjoys a considerable aesthetic improvement by offering a much more elaborate finish. Indeed, in comparison to FIG. 4, the elaborate nature of composite micromechanical component 111 is immediately apparent, both on upper face 104 and on lower face 108.

Figure 17:
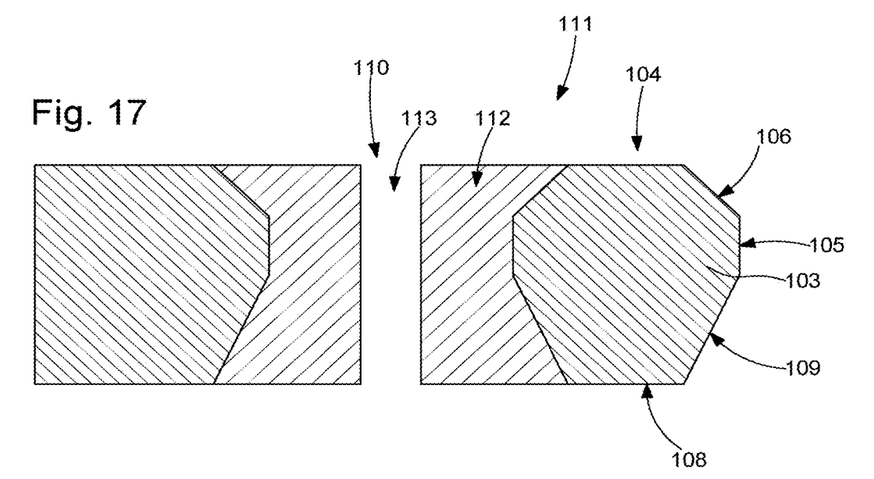
FIG. 17 is a diagram of a fabrication step of a micromechanical component according to a third embodiment of the invention.

As shown more clearly in FIG. 17, composite micromechanical component 111 thus includes a silicon-based body 103 whose vertical peripheral wall 105 borders a horizontal upper surface 104 via an upper chamfered surface 106, and, further, a horizontal lower surface 108 via a lower chamfered surface 109.

It is thus understood that the substantially rectilinear upper and lower chamfered surfaces 106, 109 provide improved mechanical strength, particularly by reducing the possibility of chips to the substantially right-angled edges respectively between the vertical peripheral and/or inner walls 105 and the upper and/or lower horizontal surfaces 104, 108 of composite micromechanical component 111.

It is also clear that vertical peripheral wall 105 provides a reduced contact surface offering an improvement as regards tribological contact with other components. Further, the recessed portions of the vertical peripheral and/or inner walls 105 are more open as a result of upper and lower chamfered surfaces 106, 109, which can enable an increase in volume capacity for receiving the metal or metal alloy part such as, for example, recessed portions 107 seen in FIG. 16, which could be filled during electrodeposition step 29. It is thus understood that the electrodeposit would be impossible to remove, due to the shapes of chamfered surfaces 106, 109 and recessed portions 107, and would even enjoy high shearing resistance.

Finally, at least one cavity 110, forming an inner wall, is at least partially filled with a metal or a metal alloy 112 to provide an attachment to composite micromechanical component 111. Thus, in the example of FIG. 17, cavity 110 could leave a cylindrical recess 113 allowing composite micromechanical component 111 to be driven onto a member, such as, for example, an arbor, with very good mechanical strength when the metal or metal alloy part 112 expands with help of the shapes of chamfered surfaces 106, 109 and possibly recessed portions 107.

Of course, the present invention is not limited to the illustrated example but is capable of various variants and modifications which will appear to those skilled in the art. In particular, an oxidizing step 20, 28, intended to smooth the silicon walls, may be performed respectively between steps 19 and 21 or between steps 27 and 21.

Further, the metal or metal alloy part 112 could even overlap over etch 53 in step 29 to form an additional functional level of composite micromechanical component 111 which would be formed only of metal or metal alloy.

Finally, micromechanical component 101 or composite micromechanical component 111 is not limited to the application to a pallets seen in FIG. 16. Thus, micromechanical component 101 or composite micromechanical component 111 can form all or part of an element in the movement or external parts of a timepiece.

By way of non-limiting example, micromechanical component 101 or composite micromechanical component 111 may thus form all or part of a balance spring, an impulse pin, a balance wheel, an arbor, a roller, a pallets such as a pallet-staff, pallet-lever, pallet-fork, pallet-stone or guard pin, a wheel set such as a wheel, arbor or pinion, a bar, a plate, an oscillating weight, a winding stem, a bearing, a case such as the case middle or horns, a dial, a flange, a bezel, a push-piece, a crown, a case back, a hand, a bracelet such as a link, a decoration, an applique, a crystal, a clasp, a dial foot, a setting stem or a push-piece shaft.

What is claimed is:

1. A method for fabricating a micromechanical component made of a silicon-based material comprising:
    taking a silicon-based substrate;
    forming a mask pierced with holes on a horizontal portion of the substrate;
    etching, in an etching chamber, predetermined oblique walls, in part of a thickness of the substrate, from the holes in the mask, in order to form upper chamfered surfaces of the micromechanical component, by continually flowing both an etching gas and a passivation gas simultaneously in the etching chamber during the etching of the predetermined oblique walls while pulsing flow of at least one of the etching gas and the passivation gas;
    etching, in the etching chamber, substantially vertical walls, in at least part of the thickness of the substrate, from a bottom of an etch made in the etching of the redetermined oblique walls, in order to form peripheral walls of the micromechanical component beneath the upper chamfered surfaces; and
    releasing the micromechanical component from the substrate and the mask.

2. The method according to claim 1, wherein the etching of the predetermined oblique walls is achieved by mixing the etching gas and the passivation gas in the etching chamber in order to form the predetermined oblique walls.

3. The method according to claim 2, wherein, in the etching of the redetermined oblique walls, the continuous etching and passivation gas flows are pulsed to enhance passivation at a bottom level.

4. The method according to claim 1, wherein the etching of the substantially vertical walls is achieved by alternating an etching gas flow and a passivation gas flow in the etching chamber in order to form the substantially vertical walls.

5. The method according to claim 1, wherein, between the etching of the substantially vertical walls and the releasing of the micromechanical component, the method further comprises:
    forming a protective layer on the predetermined oblique walls and the substantially vertical walls, leaving a bottom of an etch made in the etching of the substantially vertical walls without any protective layer; and
    etching, in the etching chamber, second predetermined oblique walls, in a remaining thickness of the substrate from the bottom of the etch made in the etching of the substantially vertical walls without any protective layer, in order to form lower chamfered surfaces of the micromechanical component.

6. The method according to claim 5, wherein the etching of the second predetermined oblique walls is achieved by mixing the etching gas and the passivation gas in the etching chamber in order to form the second predetermined oblique walls.

7. The method according to claim 6, wherein, in the etching of the second predetermined oblique walls, the continuous etching and passivation gas flows are pulsed to enhance etching at a bottom level.

8. The method according to claim 5, wherein the forming of the protective layer comprises:
    oxidizing the predetermined oblique walls and the substantially vertical walls to form a protective silicon oxide layer; and
    directionally etching the protective silicon oxide layer in order to selectively remove only a part of the protective layer from the bottom of the etch made in the etching of the substantially vertical walls.

9. The method according to claim 5, wherein before the releasing of the micromechanical component, the method comprises:

filling a cavity created during the etchings of the micromechanical component, formed by an upper chamfered surface, a peripheral wall, and a lower chamfered surface, with a metal or metal alloy in order to provide an attachment to the micromechanical component.

10. The method according to claim 1, wherein an angle between the substantially vertical walls and the predetermined oblique walls is more than 10°.

11. The method according to claim 1, wherein an angle between the substantially vertical walls and the predetermined oblique walls is greater than 10° and less than 45°.

12. The method according to claim 1, wherein an angle between the substantially vertical walls and the predetermined oblique walls is greater than 20° and less than 40°.

13. The method according to claim 1, wherein in the etching of the predetermined oblique walls, the pulsing includes pulsing both the flow of the etching gas and the flow of the passivation gas at a same time during the continuous flowing of both the etching gas and the passivation gas simultaneously in the etching chamber.

* * * * *